(12) United States Patent
Odaira

(10) Patent No.: US 12,385,968 B2
(45) Date of Patent: Aug. 12, 2025

(54) STRESS TESTING CIRCUIT AND SEMICONDUCTOR MEMORY DEVICE

(71) Applicant: Winbond Electronics Corp., Taichung (TW)

(72) Inventor: Nobuhiro Odaira, Yokohama (JP)

(73) Assignee: WINDBOND ELECTRONICS CORP., Taichung (TW)

( * ) Notice: Subject to any disclaimer, the term of this patent is extended or adjusted under 35 U.S.C. 154(b) by 215 days.

(21) Appl. No.: 18/316,437

(22) Filed: May 12, 2023

(65) Prior Publication Data
US 2023/0384366 A1   Nov. 30, 2023

(30) Foreign Application Priority Data

May 25, 2022   (JP) .................................. 2022-084903

(51) Int. Cl.
*G01R 31/28*   (2006.01)

(52) U.S. Cl.
CPC ................................ *G01R 31/2879* (2013.01)

(58) Field of Classification Search
CPC ........................... G01R 31/26; G01R 31/2642; G01R 31/2648; G01R 31/2831; G01R 31/31702
See application file for complete search history.

(56) References Cited

U.S. PATENT DOCUMENTS

| 6,693,843 B1 | 2/2004 | Maffitt et al. |
| 2004/0246154 A1* | 12/2004 | Aeby .................... H04N 25/00 |
| | | 341/138 |
| 2006/0077729 A1 | 4/2006 | Lin et al. |
| 2006/0114731 A1 | 6/2006 | Park et al. |
| 2019/0164596 A1* | 5/2019 | Lee ........................ G11C 11/417 |

FOREIGN PATENT DOCUMENTS

| CN | 1466183 A | 1/2004 |
| JP | 5-325547 A | 12/1993 |
| KR | 10-2001-0013005 A | 2/2001 |
| TW | 428103 B | 4/2001 |
| TW | 201530547 A | 8/2015 |
| TW | 201710695 A | 3/2017 |

OTHER PUBLICATIONS

Korean Office Action for Korean Application No. 10-2022-0079250, dated Nov. 27, 2023, with English translation.

* cited by examiner

*Primary Examiner* — Tung X Nguyen
(74) *Attorney, Agent, or Firm* — Birch, Stewart, Kolasch & Birch, LLP

(57) ABSTRACT

The present invention provides a stress testing circuit including a control circuit. In a test mode, the control circuit controls a supply voltage which is applied to a pre-charge circuit including transistors in a semiconductor memory device. The control circuit controls the supply voltage according to the voltage of an external power supply and the threshold voltage of the transistors included in the pre-charge circuit.

19 Claims, 4 Drawing Sheets

STRESS TESTING CIRCUIT AND SEMICONDUCTOR MEMORY DEVICE

CROSS REFERENCE TO RELATED APPLICATIONS

This application claims priority of Japanese Patent Application No. 2022-084903, filed on May 25, 2022, the entirety of which is incorporated by reference herein.

BACKGROUND OF THE INVENTION

Field of the Invention

The present invention relates to stress testing circuit and semiconductor memory device.

Description of the Related Art

In tradition, a burn-in test is performed to test the reliability of integrated circuits before or after a packaging process of semiconductor memory devices such as DRAMs (Dynamic Random Access Memories) and SRAMs (Static Random Access Memories). Specifically, a burn-in test, for example, judges the quality of memory cells that are integrated in a chip by setting the pre-charge voltage that is applied to a bit line to the voltage of an external power supply or a higher high-voltage (referred to as "stress voltage") for a long period. For this reason, test devices and semiconductor memory devices are provided with stress testing circuits for supplying a stress voltage for burn-in tests (e.g., Japan patent JPH05325547A).

In addition, the bit line pre-charge circuit includes more than one transistor (e.g., N-type or P-type MOSFET (Metal-Oxide-Semiconductor Field Effect Transistor), etc.), and is configured to set the output bit line pre-charge voltage as a stress voltage by turning on more than one transistor in a burn-in test.

However, the stress voltage supplied by the bit line pre-charge circuit is decided by the threshold voltage of transistors and the reverse bias effect, so it is possible that the stress voltage actually supplied is lower than the expected stress voltage. In this case, it may become difficult to supply a sufficient stress voltage in the burn-in test.

BRIEF SUMMARY OF THE INVENTION

In view of the above issues, the present invention is aimed at providing a stress testing circuit and a semiconductor memory device capable of supplying an appropriate stress voltage.

The present invention provides a stress testing circuit, comprising a control circuit. The control circuit controls the supply voltage that is applied to a pre-charge circuit (which includes transistors) in a semiconductor memory device in a testing mode. The control circuit controls the supply voltage based on the external power supply voltage and the threshold voltage of the transistors in the pre-charge circuit.

According to the above invention, even when the threshold voltages of the transistors of the pre-charge circuit vary, it is possible to supply a sufficient supply voltage corresponding to the threshold voltage to the pre-charge circuit in the burn-in test. This is possible because the supply voltage can be controlled based on the external power supply voltage and/or the threshold voltages of the transistors of the pre-charge circuit. An appropriate stress voltage can thereby be applied to the semiconductor memory device to perform a reliability test on the semiconductor.

DETAILED DESCRIPTION OF THE INVENTION

Figure 1:
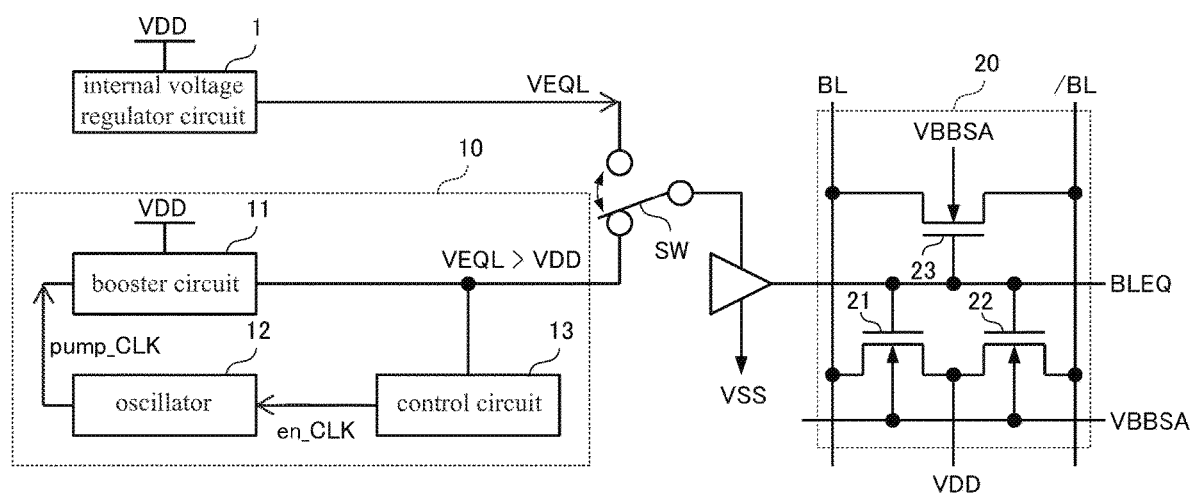
FIG. 1 is a block diagram showing an exemplified configuration of a stress testing circuit and a semiconductor memory device according to an embodiment of the present invention.

As shown in FIG. 1, in the present embodiment, the semiconductor memory device comprises an internal voltage regulator circuit 1, a stress testing circuit 10, a switch SW, and a pre-charge circuit 20. To simplify the explanation, well-known configurations such as command decoders, memory cell arrays, and input/output interface units (interface pins, etc.) of the semiconductor memory device are not shown here.

The internal voltage regulator circuit 1 is configured to receive an external power supply and generate an internal voltage based on the external power supply voltage VDD. Furthermore, the internal voltage generated by the internal voltage regulator circuit 1 can be the supply voltage VEQL provided to one or more other circuits (including the pre-charge circuit 20) driven by the internal voltage. The level of the internal voltage can be lower than the level of the external power supply voltage VDD. In some embodiments, the internal voltage regulator circuit 1 can include other well-known configurations such as a level shifter that shifts the internal voltage level according to other circuits to which the internal voltage is supplied, and so on.

The stress testing circuit 10 includes a booster circuit 11, an oscillator 12 and a control circuit 13.

The booster circuit 11 is configured to boost the received power supply voltage to generate a supply voltage VEQL. For example, the booster circuit 11 is configured to boost the external power supply voltage VDD, and output the boosted voltage as the supply voltage VEQL (in this case, VEQL>VDD). The booster circuit 11 can also be configured to use a well-known charge pump circuit.

The oscillator 12 is configured to generate a clock signal pump_CLK for driving the booster circuit 11. For example, when the oscillator 12 is activated by the signal en_CLK1 output by the control circuit 13, it generates the clock signal pump_CLK to the booster circuit 11. Note that the operation of the booster circuit 11 based on the clock signal pump_CLK is the same as the well-known technique, so the description thereof will be omitted in the present embodiment.

In the burn-in test, the control circuit 13 is configured to control the supply voltage VEQL that is applied to the pre-charge circuit 20 including the N-type MOSFETs 21, 22, and 23 in the semiconductor memory device. Here, the burn-in test mode is an example of the "test mode" of the present invention.

Furthermore, the control circuit 13 can also monitor the supply voltage VEQL output from the booster circuit 11. More specifically, the control circuit 13 can set the supply voltage VEQL generated by the booster circuit 11 to a predetermined level by the oscillator 12, thereby controls the supply voltage VEQL. Therefore, the supply voltage VEQL can be set as making the pre-charge circuit 20 generate an appropriate stress voltage by controlling the oscillator 12, the booster circuit 11 and the threshold voltage Vth of the N-type MOSFETs 21, 22, and 23 included in the pre-charge circuit 20.

The switch SW is configured to connect to the internal voltage regulator circuit 1 or the stress testing circuit 10 at one end and connect to the pre-charge circuit 20 at the other end. For example, when the semiconductor memory device operates in the normal operation mode, the switch SW is controlled to connect the internal voltage regulator circuit 1 at one end. Therefore, in the normal operation mode, the supply voltage VEQL applied to the pre-charge circuit 20 is the internal voltage lower than the external power supply voltage VDD. On the other hand, when the semiconductor memory device operates in the burn-in test mode, the switch SW is controlled to connect the stress testing circuit 10 at one end. Therefore, in the burn-in test mode, the supply voltage VEQL that is applied to the pre-charge circuit 20 is higher than the external power supply voltage VDD.

In the present embodiment, the pre-charge circuit 20 is configured to pre-charge a pair of complementary bit lines BL and/BL connected to a memory cell array (not shown in the figure). Thus, in the burn-in test, bit lines BL and/BL in the semiconductor memory device can be pre-charged with an appropriate stress voltage. Furthermore, in this embodiment, the pre-charge circuit 20 includes three N-type MOS-FETs 21, 22 and 23.

In the pre-charge circuit 20, the drains of the N-type MOSFETs 21 and 22 are connected to the external power supply voltage VDD. The source of the N-type MOSFET 21 and the drain of the N-type MOSFET 23 are connected to the bit line BL. The sources of the N-type MOSFETs 22 and 23 are connected to the bit line/BL. The supply voltage VEQL output from the internal voltage regulator circuit 1 or the stress testing circuit 10 is applied to the gates of the N-type MOSFETs 21 and 22 as the gate voltage BLEQ. An identical reverse bias voltage VBBSA is applied to the N-type MOS-FETs 21, 22 and 23. Here, in the present embodiment, the N-type MOSFET 21 is an example of the "fourth transistor"; the N-type MOSFET 22 is an example of the "fifth transistor"; the N-type MOSFET 23 is an example of the "sixth transistor"; the bit line BL is an example of the "first bit line"; and the bit line/BL is an example of the "second bit line".

In the present embodiment, each of the N-type MOSFETs 21, 22 and 23 can have the same size (width and length of the channel). In this case, the gain coefficients of the N-type MOSFETs 21, 22 and 23 can be equal.

A pair of complementary bit lines BL and/BL are connected to a sense amplifier respectively (not shown in the figure). Since details of data control and pre-charge operation for memory cells (not shown in the figure) in a memory cell array (not shown in the figure) in the normal operation mode are the same as well-known techniques, description thereof is omitted in this embodiment.

Figure 2:
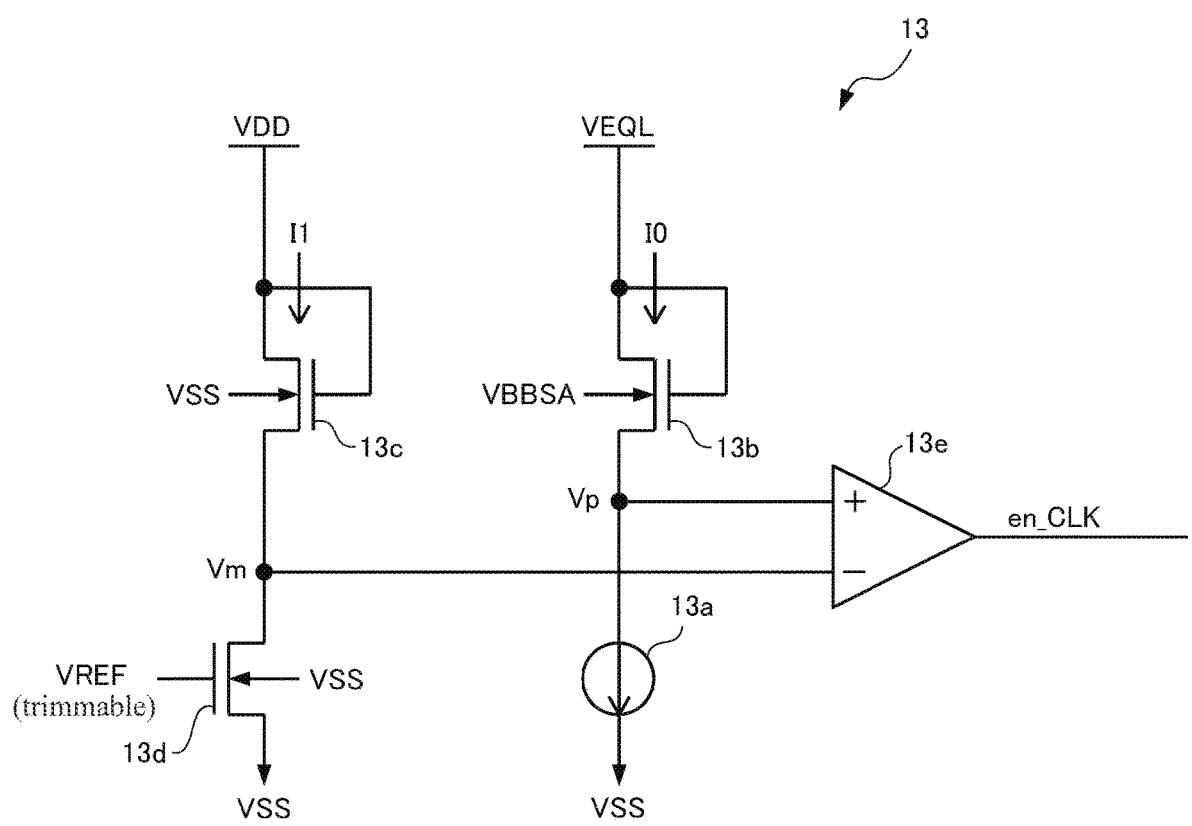
FIG. 2 is a diagram showing an exemplified configuration of a control circuit.

As shown in FIG. 2, the control circuit 13 includes a constant current source 13a, three N-type MOSFETs 13b, 13c and 13d, and a comparator 13e.

The constant current source 13a is connected between the source of the N-type MOSFET 13b and a low power supply voltage VSS (VSS<VDD and VEQL).

The drain and the gate of the N-type MOSFET 13b are connected to the supply voltage VEQL output from the booster circuit 11. In this embodiment, a reverse bias voltage VBBSA equal to the reverse bias voltage VBBSA applied to the N-type MOSFETs 21, 22, and 23 included in the pre-charge circuit 20 is applied to the N-type MOSFET 13b. Therefore, the supply voltage VEQL can be set in a state where the threshold voltage Vth of the N-type MOSFET 13b and the threshold voltage Vth of the N-type MOSFETs 21, 22, and 23 included in the pre-charge circuit 20 are equal. Furthermore, in this embodiment, the N-type MOSFET 13b can have the same size (width and length of the channel) as those of N-type MOSFETs 21, 22, and 23 included in the pre-charge circuit 20. Therefore, the supply voltage VEQL can be set in a state where the gain coefficient of the N-type MOSFET 13b and the gain coefficients of the N-type MOS-FETs 21, 22 and 23 included in the pre-charge circuit 20 are equal. The N-type MOSFET 13b is an example of the "first transistor" of the present invention.

The drain and the gate of the N-type MOSFET 13c are connected to the external power supply voltage VDD. The source of the N-type MOSFET 13c is connected to the drain of the N-type MOSFET 13d. The low power supply voltage VSS is applied to the N-type MOSFET 13c as a reverse bias voltage. The N-type MOSFET 13c is an example of the "second transistor" of the present invention.

The gate of the N-type MOSFET 13d is connected to the reference voltage VREF. Here, the reference voltage VREF can be trimmably generated by a reference voltage regulator unit (not shown in the figure). The reference voltage VREF can be lower than the external power supply voltage VDD. The source of the N-type MOSFET 13d is connected to the low power supply voltage VSS. The low power supply voltage VSS is applied to the N-type MOSFET 13d as a reverse bias voltage. The N-type MOSFET 13d is an example of the "third transistor" of the present invention.

The +terminal of the comparator 13e is connected to a connection node between the source of the N-type MOSFET 13b and the constant current source 13a. The −terminal of the comparator 13e is connected to the connection node between the source of the N-type MOSFET 13c and the drain of the N-type MOSFET 13d. The comparator 13e outputs signal en_CLK for controlling activation and deactivation of the oscillator 12. In this embodiment, the oscillator 12 is configured to be activated when the signal en_CLK is at the low level, and is deactivated when the signal en_CLK is at the high level.

The operation of the control circuit 13 in the present embodiment will be described as follows. Assuming that the current flowing through the N-type MOSFET 13c and the N-type MOSFET 13d of the control circuit 13 is I1, I1 can be expressed as follows, according to the current equation of the MOSFET saturation region.

[Equation 1]

$$I1 = \frac{\beta}{2}(VDD - Vm - Vth)^2 = \frac{\beta}{2}(VREF - Vth)^2 \quad (1)$$

In equation (1), β is the gain coefficient, Vm is the electric potential of the connection node between the source of the N-type MOSFET 13c and the drain of the N-type MOSFET 13d, and Vth is the threshold voltage of the N-type MOS-FETs 13c and 13d. Then, the following equation (2) can be expressed according to equation (1).

[Equation 2]

$$Vm = VDD - VREF \quad (2)$$

Next, assuming that the current flowing through the N-type MOSFET 13*b* of the control circuit 13 and the constant current source 13*a* is I0, I0 can be expressed as follows, according to the current equation of the MOSFET saturation region.

[Equation 3]

$$I0\frac{\beta}{2} = (VEQL - Vp - Vth)^2 \quad (3)$$

In equation (3), Vp is the electric potential of the connection node between the source of the N-type MOSFET 13*b* and the constant current source 13*a*, and Vth is the threshold voltage of the N-type MOSFET 13*b*. Then, the following equation (4) can be expressed according to equation (3).

[Equation 4]

$$Vp = VEQL - Vth - \sqrt{\frac{2I0}{\beta}} \quad (4)$$

Assuming that Vm and Vp are equal, the following equation (5) can be expressed based on equation (2) and equation (4).

[Equation 5]

$$VDD - VREF = VEQL - Vth - \sqrt{\frac{2I0}{\beta}} \quad (5)$$

Furthermore, the following equation (6) can be expressed according to equation (5).

[Equation 6]

$$VEQL = VDD + Vth + \sqrt{\frac{2I0}{\beta}} - VREF \quad (6)$$

As shown in the above equation (6), the control circuit 13 controls the supply voltage VEQL increase as the external power supply voltage VDD increases. Therefore, since it is possible to raise the supply voltage VEQL by raising the external power supply voltage VDD, the supply voltage VEQL can be controlled easily.

Furthermore, as shown in the above equation (6), the control circuit 13 can control the supply voltage VEQL increase as the threshold voltage Vth of the N-type MOSFET 13*b* (which is equal to the threshold voltages Vth of the N-type MOSFETs 21, 22, and 23 in the pre-charge circuit 20) increases. As a result, since the supply voltage VEQL can be increased by increasing the threshold voltages Vth of the N-type MOSFETs 21, 22, and 23 in the pre-charge circuit 20, it is possible to control the pre-charge circuit 20 to apply a sufficient stress voltage that corresponds to the threshold voltage Vth.

Furthermore, as shown in the above equation (6), the control circuit 13 can trim the supply voltage VEQL by trimming the reference voltage VREF.

Furthermore, when the supply voltage VEQL output from the booster circuit 11 is lower than the right side of the equation (6), the low level signal en_CLK is output from the comparator 13*e*. On the other hand, when the supply voltage VEQL output from the booster circuit 11 is higher than or equal to the right side of the equation (6), the comparator 13*e* outputs the high level signal en_CLK.

Figure 3:
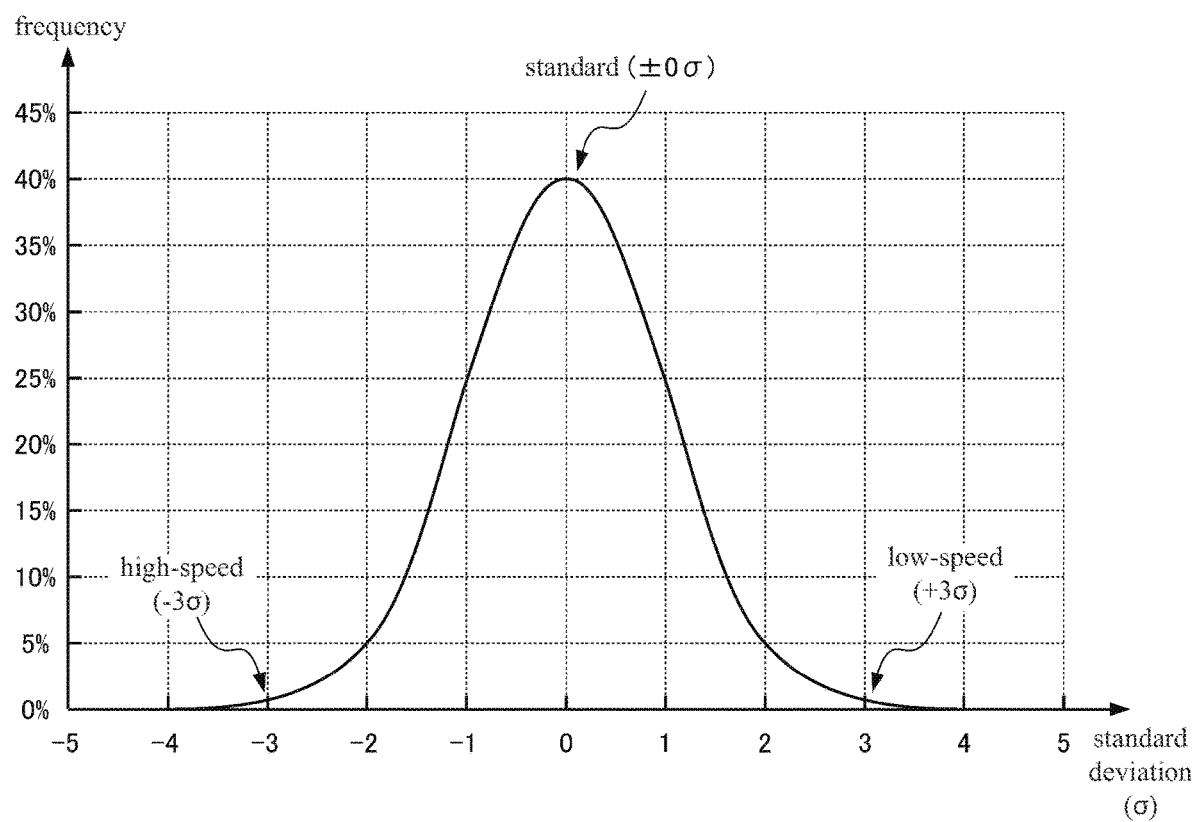
FIG. 3 is a distribution diagram showing variations in threshold voltages of transistors.

Generally, variations in the threshold voltage Vth of a MOSFET follows a standard normal distribution as shown in FIG. 3. Here, when the standard deviation σ becomes larger than 0, the threshold voltage Vth of the MOSFET included in the standard deviation σ becomes higher than the threshold voltage Vth of the standard (σ=±0) MOSFET. In this case, the saturation current of the MOSFET decreases, and the response time becomes longer. Therefore, in this embodiment, a MOSFET in the standard deviation σ=+3 is called a low-speed MOSFET. On the other hand, when the standard deviation σ becomes smaller than 0, the threshold voltage Vth of the MOSFET in the standard deviation σ becomes lower than the threshold voltage Vth of the standard (σ=±0) MOSFET. In this case, the saturation current of the MOSFET increases, and the response time becomes shorter. Therefore, in this embodiment, a MOSFET in the standard deviation σ=−3 is called a high-speed MOSFET.

Figure 4:
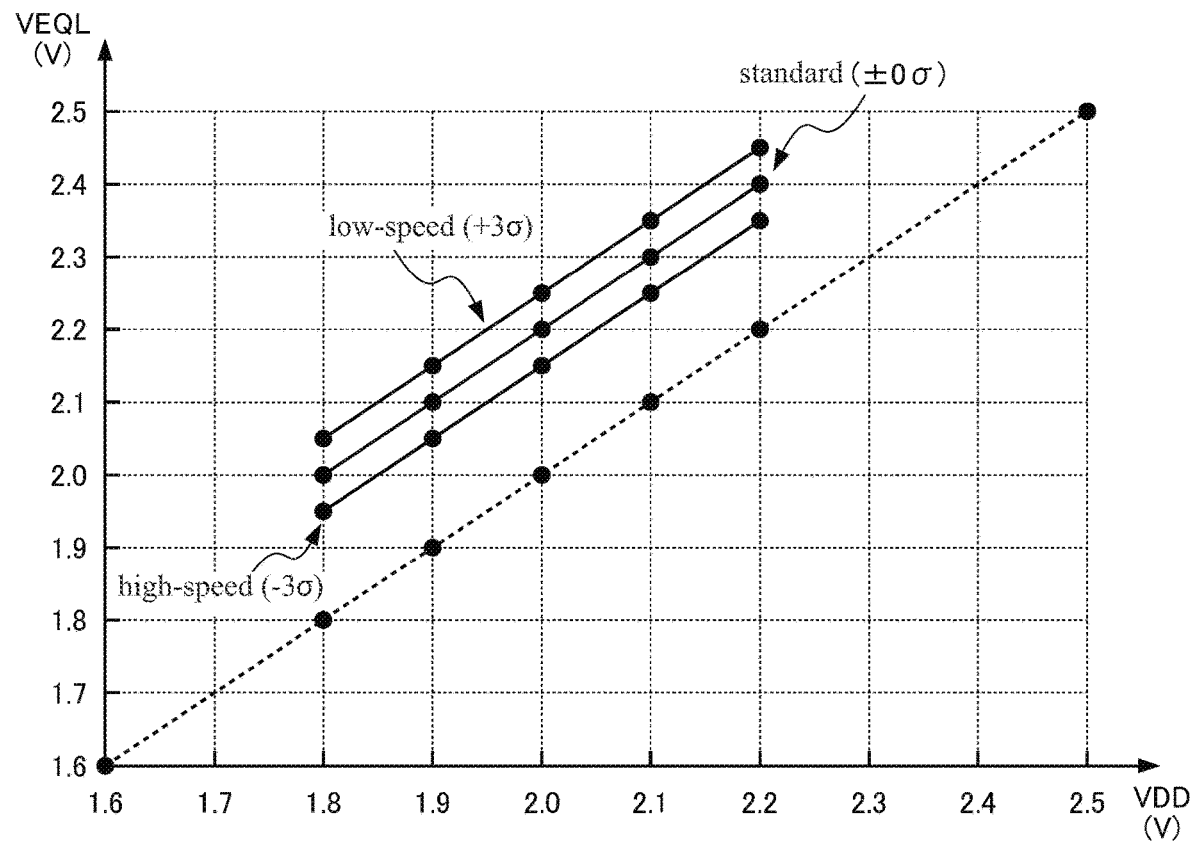
FIG. 4 is a diagram showing the relationship between the external power supply voltage and the supply voltage.

As shown in FIG. 4, the supply voltage VEQL of each of the high-speed MOSFET, the standard MOSFET, and the low-speed MOSFET is proportional to the external power supply voltage VDD. Furthermore, when the external power supply voltage VDD is the same (constant), the supply voltage VEQL can be decreased as the threshold voltage Vth decreases (i.e., as the speed of the MOSFET becomes higher). Therefore, it is possible to provide an appropriate stress voltage according to variations in the threshold voltage Vth of the MOSFETs in the pre-charge circuit 20.

As described above, according to the stress testing circuit 10 and the semiconductor memory device of this embodiment, since the supply voltage VEQL is controlled based on the external power supply voltage VDD and/or the threshold voltage Vth of the N-type MOSFETs 21, 22, and 23 in the pre-charge circuit 20, even if the threshold voltages Vth of the N-type MOSFETs 21, 22, and 23 vary, a sufficient supply voltage that corresponds to the variation of the threshold voltage Vth can be applied to the pre-charge circuit 20 in the burn-in test.

Furthermore, according to the stress testing circuit 10 and the semiconductor memory device of the present embodiment, the supply voltage VEQL is generated based on the external power supply voltage VDD and the threshold voltage Vth of the N-type MOSFETs 21, 22, and 23 in the pre-charge circuit 20. Therefore, the voltage VEQL can be set by controlling the oscillator 12 and the booster circuit 11, making the pre-charge circuit receiving the supply voltage VEQL able to provide an appropriate stress voltage.

Furthermore, according to the stress testing circuit 10 and the semiconductor memory device of the present embodiment, it is possible to control the oscillator 12 and the booster circuit 11 to set the supply voltage VEQL based on the external power supply voltage VDD and the threshold voltage Vth of the N-type MOSFETs 21, 22, and 23 in the pre-charge circuit 20.

Furthermore, according to the stress testing circuit 10 and the semiconductor memory device of the present embodiment, a pair of complementary bit lines BL and /BL can be pre-charged by the pre-charge circuit 20.

The embodiments described above are described to facilitate understanding of the present invention, and are not described to limit the present invention. Therefore, each element disclosed in the above embodiments is meant to include all design modifications and equivalents within the technical scope of the present invention.

For example, in the embodiments described above, a case where the stress testing circuit 10 is provided in the DRAM has been described as an example. However, the present invention is not limited to this case. For example, the stress testing circuit 10 can be provided in a SRAM, a flash memory, RRAM, MRAM or other semiconductor memory devices. Besides, the semiconductor memory devices of the present disclosure may be used on automotive electronics, such as Advanced Driver Assistance Systems (ADAS), Instrument Clusters, Infotainment. The semiconductor memory devices of the present disclosure may be used on Industrial applications, such as aerospace, medical, safety equipment, health & fitness, industrial controls, instrumentation, security, transportation, telecommunications, PoS machines, human machine interface, programmable logic controller, smart meter, and industrial networking. The semiconductor memory devices of the present disclosure may be used on communication and networking devices such as STB, switches, routers, passive optical networks, xDSL, wireless access point, cable modem, power line communications M2M, mobile phones, base stations, DECT phones, and many other new communication products. The semiconductor memory devices of the present disclosure may be used on desktops, notebooks, servers, gaming notebooks, ultrabooks, tablets, convertibles, HDD, and SSD. The semiconductor memory devices of the present disclosure may be used on space constrained applications including Wearable, MP3 players, smart watches, games, digital radio, toys, cameras, digital photo album, GPS, Bluetooth and WiFi modules. The semiconductor memory devices of the present disclosure may be used on television, display and home electronics.

Furthermore, in the embodiments described above, a case where the control circuit 13 includes three N-type MOSFETs 13b, 13c, and 13d has been described as an example. However, the present invention is not limited to this case. For example, the control circuit 13 can be configured by replacing the three N-type MOSFETs 13b, 13c, 13d with three P-type MOSFETs.

Furthermore, in the embodiments described above, a case where the pre-charge circuit 20 is configured to include three N-type MOSFETs 21, 22, and 23 has been described as an example. However, the present invention is not limited to this case. For example, the pre-charge circuit 20 can be configured by replacing the three N-type MOSFETs 21, 22 and 23 with three P-type MOSFETs.

Furthermore, in the embodiments described above, a case where the pre-charge circuit 20 is configured to pre-charge a pair of complementary bit lines BL and/BL has been described as an example. However, the present invention is not limited to this case. For example, the pre-charge circuit 20 can be configured to pre-charge a pair of word lines or IO lines (local IO line/main IO line) and so on, or pre-charge adjacent bit lines or adjacent word lines.

Also, the configurations of the stress testing circuit 10, the pre-charge circuit 20, and the control circuit 13 shown in FIG. 2 are merely examples, and can be modified as appropriate, or adopt a known configuration or other various configurations.

What is claimed is:

1. A stress testing circuit, comprising:
   a control circuit, configured to control a supply voltage which is applied to a pre-charge circuit including transistors in a semiconductor memory device in a testing mode;
   a booster circuit, configured to boost the external power supply voltage and generate the supply voltage; and
   an oscillator, configured to generate a clock signal that drives the booster circuit;
   wherein the control circuit controls the supply voltage based on an external power supply voltage and a threshold voltage of the transistors in the pre-charge circuit;
   wherein the control circuit controls the supply voltage by controlling the oscillator to set the supply voltage generated by the booster circuit to a predetermined level.

2. The stress testing circuit as claimed in claim 1, wherein the pre-charge circuit is configured to pre-charge a bit line in the semiconductor memory device.

3. The stress testing circuit as claimed in claim 1, wherein the control circuit controls the supply voltage increase as the external power supply voltage increases.

4. The stress testing circuit as claimed in claim 1, wherein the control circuit controls the supply voltage increase as the threshold voltage increases.

5. The stress testing circuit as claimed in claim 1, wherein the control circuit further comprises:
   a constant current source;
   a first transistor, connected between the supply voltage and the constant current source;
   a second transistor, connected to the external power supply voltage;
   a third transistor, connected between the second transistor and a low power supply voltage; and
   a comparator, including a first input terminal and a second input terminal,
      wherein the first input terminal is connected to the node between the first transistor and the constant current source, the second input terminal is connected to the node between the second transistor and the third transistor, and a signal for controlling the oscillator is output based on signals input to the first input terminal and the second input terminal respectively.

6. The stress testing circuit as claimed in claim 5, wherein the first transistor is supplied with a reverse bias voltage that is equal to the reverse bias applied to a transistor of the pre-charge circuit.

7. The stress testing circuit as claimed in claim 5, wherein the size of the first transistor is the same as the size of the transistor included in the pre-charge circuit.

8. The stress testing circuit as claimed in claim 5, wherein the pre-charge circuit comprises:
   a fourth transistor, connected between the external power supply voltage and a first bit line in the semiconductor memory device;
   a fifth transistor, connected between the external power supply voltage and a second bit line in the semiconductor memory device;
   a sixth transistor, connected between the first bit line and the second bit line in the semiconductor memory device.

9. A semiconductor memory device, comprising:
   a pre-charge circuit including transistors, configured to generate a stress
      voltage according to a supply voltage when the semiconductor memory device operates in a testing mode;
   a stress testing circuit, comprising a control circuit configured to control the supply voltage which is applied to the pre-charge circuit in the testing mode, wherein the control circuit controls the supply voltage based on an external power supply voltage and a threshold voltage of the transistors in the pre-charge circuit;

an internal voltage regulator circuit, configured to receive the external power supply voltage and generate an internal voltage based on the external power supply voltage; and a switch, connected to the internal voltage regulator circuit or the stress testing circuit at one end, and connected to the pre-charge circuit at the other end, wherein the switch is controlled to connect the stress testing circuit when operating in the testing mode.

10. The semiconductor memory device as claimed in claim 9, wherein the pre-charge circuit is configured to pre-charge a bit line in the semiconductor memory device.

11. The semiconductor memory device as claimed in claim 9, wherein the control circuit controls the supply voltage increase as the external power supply voltage increases.

12. The semiconductor memory device as claimed in claim 9, wherein the control circuit controls the supply voltage increase as the threshold voltage increases.

13. The semiconductor memory device as claimed in claim 9, wherein the stress testing circuit further comprises:

a booster circuit, configured to boost the external power supply voltage and generate the supply voltage; and an oscillator, configured to generate a clock signal that drives the booster circuit;

wherein the control circuit controls the supply voltage by controlling the oscillator to set the supply voltage generated by the booster circuit to a predetermined level.

14. The semiconductor memory device as claimed in claim 13, wherein the control circuit further comprises:

a constant current source;

a first transistor, connected between the supply voltage and the constant current source;

a second transistor, connected to the external power supply voltage;

a third transistor, connected between the second transistor and a low power supply voltage; and a comparator, including a first input terminal and a second input terminal, wherein the first input terminal is connected to the node between the first transistor and the constant current source, the second input terminal is connected to the node between the second transistor and the third transistor, and a signal for controlling the oscillator is output based on signals input to the first input terminal and the second input terminal respectively.

15. The semiconductor memory device as claimed in claim 14, wherein the first transistor is supplied with a reverse bias voltage that is equal to the reverse bias applied to a transistor of the pre-charge circuit.

16. The semiconductor memory device as claimed in claim 14, wherein the size of the first transistor is the same as the size of the transistor included in the pre-charge circuit.

17. The semiconductor memory device as claimed in claim 14, wherein the pre-charge circuit comprises:

a fourth transistor, connected between the external power supply voltage and a first bit line in the semiconductor memory device;

a fifth transistor, connected between the external power supply voltage and a second bit line in the semiconductor memory device;

a sixth transistor, connected between the first bit line and the second bit line in the semiconductor memory device.

18. The semiconductor memory device as claimed in claim 9, wherein the pre-charge circuit is configured to pre-charge a pair of word lines in the semiconductor memory device.

19. The semiconductor memory device as claimed in claim 9, wherein the pre-charge circuit is configured to pre-charge a pair of IO lines in the semiconductor memory device.

* * * * *